United States Patent [19]

Khanna et al.

[11] Patent Number: 5,260,162

[45] Date of Patent: Nov. 9, 1993

[54] PHOTOSENSITIZER COMPOSITIONS CONTAINING DIAZO FLUORINATED ESTERS OF HEXAFLUORO-BIS-PHENOLS OR BIS-HEXAFLUOROETHERS

[76] Inventors: Dinesh N. Khanna, 39 Musket Rd.; Robert E. Potvin, 25 Woodbine St., both of West Warwick, Kent, R.I. 02893

[21] Appl. No.: 628,549

[22] Filed: Dec. 17, 1990

[51] Int. Cl.$^5$ .................... G03F 7/022; G03F 7/023
[52] U.S. Cl. ..................... 430/190; 430/165; 430/191; 430/192; 430/193; 430/906; 534/557
[58] Field of Search ............... 528/185; 430/190, 193, 430/191, 192; 534/557

[56] References Cited

U.S. PATENT DOCUMENTS

| | | | |
|---|---|---|---|
| 3,188,210 | 6/1965 | Fritz et al. | 430/193 |
| 3,640,992 | 2/1972 | Sus et al. | 534/557 |
| 3,669,658 | 6/1972 | Yonezawa et al. | 430/193 |
| 4,555,469 | 11/1985 | Erdmann et al. | 430/193 |
| 4,626,492 | 12/1986 | Eilbeck | 430/191 |
| 4,724,195 | 2/1988 | Müller et al. | 430/192 |
| 4,839,256 | 6/1989 | Müller | 430/192 |
| 5,037,720 | 8/1991 | Khanna | 430/190 |
| 5,037,949 | 8/1991 | Mueller et al. | 528/185 |
| 5,114,826 | 5/1992 | Kwong et al. | 430/192 |

FOREIGN PATENT DOCUMENTS 2010594 8/1990 Canada .

Primary Examiner—Charles L. Bowers, Jr.
Assistant Examiner—Christopher G. Young

[57] ABSTRACT

A photosensitizer composition comprising a diazo fluorinated ester containing the hexafluoroisopropylidene group, said photosensitizer selected from hexafluoro-bis-phenols having the following formula:

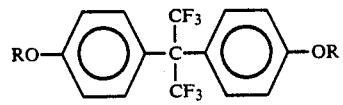

where R is selected from hydrogen, methyl, ethyl and phenyl; and bis-hexafluoroethers having the following formula:

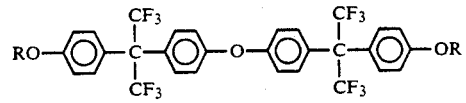

wherein R' is selected from hydrogen, methyl, ethyl and phenyl.

12 Claims, No Drawings

PHOTOSENSITIZER COMPOSITIONS CONTAINING DIAZO FLUORINATED ESTERS OF HEXAFLUORO-BIS-PHENOLS OR BIS-HEXAFLUOROETHERS

BACKGROUND OF THE INVENTION

The present invention relates to novel sensitizers of diazo fluorinated esters containing the hexafluoroisopropylidene group. The diazo photosensitizers of the invention are extremely compatible with fluorinated hydroxy polyamides, are soluble in commonly used solvents and, in combination with fluorinated hydroxy polyamides, and other hydroxy resins such as, hydroxy styrenes or Novolaks, provide photosensitive compositions which, when coated on a suitable substrate, provide a uniform coating and develop well in light/dark regions.

Applications Ser. No. 915,342 and Ser. No. 124,634, the disclosures of which are incorporated herein by reference thereto, relate to fluorinated hydroxy polyamide polymers having hexafluoroisopropylidene linking groups and their use in making base developable positive acting high speed photoresists. The present invention relates to esters which are produced from hexafluoro-bis-phenols and bis-hexafluoroethers which can be used to produce the aminophenols and aminoethers useful in the production of the fluorinated hydroxy polyamide resins disclosed in said applications and to photosensitive compositions which comprise the sensitizers of the present invention in combination the fluorinated hydroxy polyamide resins disclosed in said applications.

Generally, polyamide photosensitive compositions are available as high temperature-resistant resinous compositions which are soluble in conventional alkaline solvents and developers. This solubility is preserved in the positive photoresist process in which the exposed, uncoupled areas of the photoresist coating retain their original solubility while the unexposed masked areas are coupled with an azo photosensitzer to a condition in which they are rendered insoluble in alkaline developers. Reference is made to U.S. Pat. Nos. 4,093,461; 4,339,521 and 4,395,482 which disclose such positive-acting photoresist compositions.

In the industrial application of positive photoresists, the polymeric component and the radiation sensitizer are dissolved in an organic solvent or mixture of solvents and applied as a thin film or coating to a substrate suitable for the desired application.

The polymeric component of these photoresist formulations is desirably soluble in aqueous alkaline solutions, but the sensitizer acts as a dissolution rate inhibitor with respect to the polymer. Upon exposure of selected areas of the coated substrate to actinic radiation, the sensitizer undergoes a radiation induced structural transformation and the exposed areas of the coating are rendered more soluble than the unexposed areas. This difference in solubility rates normally causes the exposed areas of the photoresist coating to be dissolved when the substrate is immersed in alkaline developing solution leaving the unexposed areas substantially intact, thus producing a positive relief pattern on the substrate.

In most applications, the exposed and developed substrate will be subjected to treatment by a substrate-etchant solution. The resist coating protects the coated areas of the substrate from the etchant and thus the etchant is only able to etch the uncoated areas of the substrate, which in the case of a positive photoresist, corresponds to the areas that were exposed to actinic radiation. Thus, an etched pattern can be created on the substrate which is a positive of the pattern of the mask, stencil, template, etc., that was used to create selective exposure patterns on the coated substrate prior to development.

The relief pattern of photoresist on the substrate produced by the methods described above is useful for various applications including, for example, as an exposure mask or a pattern such as is employed in the manufacture of miniaturized integrated electronic components or the manufacture of a printing plate.

The properties of a photoresist composition which are important in commercial practice include the solubility of the photoresist in the application solvent, the photospeed of the photoresist, development contrast, environmentally acceptable developer solubility, photoresist resolution and adhesion, dimensional stability at elevated temperature and abrasion resistance.

Photospeed is important for a photoresist, particularly in applications where a number of exposures are needed, for example, in generating multiple patterns by a repeated process, or where light of reduced intensity is employed, such as in projection exposure techniques where the light is passed through a series of lenses and mono-chromatic filters. Thus, high, controlled photospeed is particularly important for a photoresist composition employed in processes where a number of multiple exposures must be made to produce a mask or series of circuit patterns on a substrate. Control of the photospeed is extremely important in order to produce high resolution relief patterns in microcircuitry; e.g., a photospeed too high can result in narrowing the processing conditions.

Photoresist resolution refers to the capability of a photoresist system to reproduce the smallest equally spaced line pairs and intervening spaces of a mask which is utilized during exposure with a high degree of image edge acuity in the developed exposed spaces. In many industrial applications, particularly in the manufacture of miniaturized electronic components, a photoresist is required to provide a high degree of resolution for very small line and space widths (on the order of about a micron).

The ability of a photoresist to reproduce very small dimensions, on the order of about a micron, is extremely important in the production of large scale integrated circuits on silicon chips and similar components. Circuit density on such a chip can be increased, assuming photolithography techniques are utilized, by increasing the resolution capabilities of the resist.

Various attempts have been made in the prior art to produce high temperature positive photoresists possessing the above desired properties. For example, co-pending application Ser. No. 363,245, filed Jun. 8, 1989, relates to hydroxylated polyamide and polyimide polymers, wherein a predetermined percentage of the hydroxy groups are reacted with an azo quinone sulfonyl chloride photosensitizer to form unitary self-sensitive polymers useful for photoresist compositions. However, the self-photosensitized polymers of this application have predetermined solubility properties which develop predetermined degrees of alkali-solubility upon exposure to actinic radiation. Thus, once the basic polymer is produced, the predetermined solubility properties cannot be changed. This means that large inventories must be retained of polymers having varying solubility properties and the producer must accurately predict the solubility characteristics of photoresists to be ordered in the future.

U.S. Pat. No. 4,093,461 discloses a heat resistant, positive photoresist composition comprising a quinone or naphthoquinone diazide and the polycondensation product of an aromatic dianhydride (pryomellitic anhydride) and an aromatic diamine (4,4'-diaminodiphenylether). The properties of the positive photoresist of the patent are discussed in U.S. Pat. No. 4,395,482 (column 1, lines 46–64). There it is pointed out that the positive photoresist composition of U.S. Pat. No. 4,093,461 has limited storage life, insufficient stability to alkaline etching solutions and relatively small differences in solubility between the exposed and unexposed portions of the photoresist.

The exceptional dielectric and high temperature resistance properties of polyamides make them particularly useful in the semiconductor industry. They can be used, for example, as dielectric layers, alpha particle barriers in memory devices, ion implantation masks and passivation layers. The goal of numerous development programs has been the development of a simple, reliable and cost effective radiation sensitive polyamide system that could be used with common photolithographic equipment and processes.

The present invention uses the fluorinated hydroxy polyamides of application Ser. No. 915,342 or Ser. No. 124,634 as a binder material to provide positive photosensitive compositions; e.g., an alkali soluble fluorinated hydroxy polyamide in combination with the novel diazo fluorinated sensitizer of the present invention to provide novel high temperature-resistant photosensitive compositions having easily adjustable base solubilities, good shelf life, rapid development and cure properties and high dimensional stability, for producing uniform patterns with excellent resolution and adhesion properties.

The fluorinated diazo sensitizers of the present invention are also applicable for making photorisist invention are also compositions using Novolaks, Hydroxy styrene type resin and hydroxy polyimide type resins disclosed in U.S. Pat. No. 4,927,736.

SUMMARY OF THE INVENTION

The present invention is based upon the discovery that the hexaflouro-bis-phenols and bis-hexafluoroethers similar to those which can be used to produce the alkali-soluble fluorinated hydroxy-containing polyamides of co-pending applications Ser. No. 915,342 and Ser. No. 124,634, can be reacted with diazo sulfonyl chlorides to produce novel diazo photosensitizers. The present invention also encompasses novel photosensitive compositions which include the combination of these novel diazo photosensitizers with the polyamides of the aforementioned copending applications.

According to the present invention, the photosensitivity of the diazo sensitizers of the invention can be increased or decreased by increasing or decreasing the diazo content. The developer solubility of these sensitizers can be controlled by neutralizing the solubilizing effect of the hydroxy groups by reacting a predetermined percentage of them with a diazo sulfonyl chloride. This reaction also provides a means for increasing the photospeed of the final photosensitive composition when it is exposed to actinic radiation. The diazo sensitizers of the present invention have a diazo content of 50 to 100%, preferably 70 to 100%, most preferably 80 to 100% of theory.

Fluorinated hydroxy polyamides useful for photosensitive compositions in combination with the novel sensitizers of this invention are prepared, for example, by reacting an acid chloride with hexafluoro-2,2-bis (3-amino-4-hydroxyphenyl) propane. Other useful polyamides are prepared, for example, by reacting 4,4'-bis (2-hydroxy-hexafluoroisoproply) diphenyl ether with phenol and hydrogen fluoride and further reacting the resulting product as set forth in Example 1 of aforementioned application Ser. No. 124,634.

The present invention relates to the discovery that the aforementioned hexafluoro-bis-phenols and bis-hexafluoroethers can be reacted with diazo sulfonyl chlorides to provide sensitizers which are extremely compatible with fluorinated hydroxy polyamides in photosensitive compositions. These sensitizers are soluble in a variety of solvents such as methyl ethyl ketone, propylene glycol methyl ether, N-methylpyrrolidone and gamma-butryolactone. The solubility of these photosensitive compositions can be customized on short notice by mixing said fluorinated hydroxylated polyamides with sensitizers having various solubility properties. After exposure, the irradiated areas of photoresist coating can be developed with conventional alkaline developers in a few minutes to provide positive images having a minimum line width of one to two microns. In addition to fine resolution images the properties of the resultant photoresist also include; uniformity of coating, good photospeed, good development contrast, good adhesion, high dimensional stability, good abrasion resistance and low shrinkage.

DETAILED DESCRIPTION OF PREFERRED EMBODIMENTS

The photosensitizers and photosensitive compositions of the invention are useful in many applications, such as photopolymerizable varnishes or protective layers such as passivation overcoat films, planarization layers in microelectronic circuits, insulating layers for multi-layered hybrid circuits and as photoresists that provide relief structures of good definition on substrates such as silicon chips, polymeric films and metal plates.

The photosensitive compositions of the present invention provide polymeric layers or relief structures that exhibit high thermal and radiation stability, excellent mechanical properties and high insulating properties. These properties make the photosensitive compositions of the invention suitable for microelectronic circuit applications. Insulating and mechanical properties are of importance in electronic applications, to provide for high density circuitry devices that are structurally sound. Thermal and radiation stability are essential to withstand the high temperature and radiation environments of modern manufacturing techniques used in the electronics industry.

The novel photosensitizers and positive-acting, alkali developable photosensitive compositions of the present invention comprise the reaction product of a hexafluoro-bis phenol of the structure (1) of a bis-hexafluoroether of the structure (2) with a diazo sulfonyl chloride, such as diazo-L-sulfonyl chloride, or Diazo-F-sulfonyl chloride to produce a sensitizer resin which is extremely compatible with fluorinated hydroxy-containing polyamides in photosensitive compositions. These sensitizers can have various degrees of solubility in conventional alkaline developers, to provide maximum flexibility in quickly formulating photosensitive compositions of the desired solubility until exposed to actinic radiation.

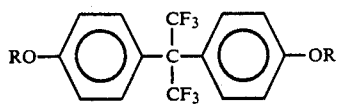

Structure (1)

wherein R is selected from hydrogen, methyl, ethyl and phenyl.

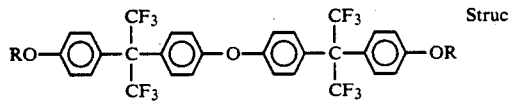

Structure (2)

wherein R is selected from hydrogen, methyl, ethyl and phenyl.

A preferred polyamide for blending with the resultant modified aminophenol sensitizer to provide photosensitive compositions can be produced by reacting hexafluoro-2,2'-bis (3-amino-4-hydroxyphenyl) propane (which is known in the art as 6-F aminophenol) with a 50/50 mixture of isophthaloyl chloride and terephthaloyl chloride, according to Example 1 of aforementioned application Ser. No. 915,342. Such polyamides preferably have the structure (3), in which Y is an equal molar mixture of isophthaloyl and terephthaloyl radicals and "n" is approximately 200.

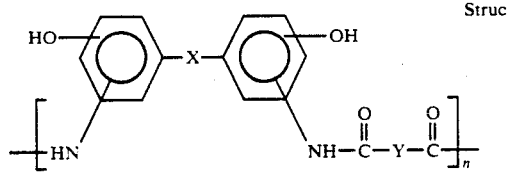

Structure (3)

where "X" is selected from the group consisting of S, SO$_2$, direct link, O, R—C—R or C=O; "Y" is selected from the group consisting of S, SO$_2$, direct link, phenyl,

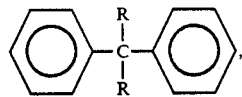

or

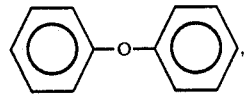

and "R" is CF$_3$, lower alkyl or phenyl, provided that at least one of either "X" or "Y" is an "R" containing group in which "R" is CF$_3$.

Another preferred polyamide for blending with the modified aminophenol sensitizer to provide photosensitive compositions can be produced by reacting 4,4'-bis (2-hydroxy-hexafluoroisopropyl) diphenyl ether with phenol and hydrogen fluoride, and further reacting the resulting product according to Example 1 of aforementioned application Ser. No. 124,634. Such polyamides preferably have the structure (4).

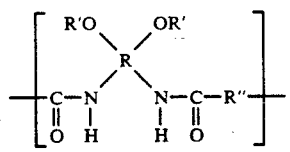

Structure (4)

wherein
(1) R is a tetravalent aromatic moiety of the formula:

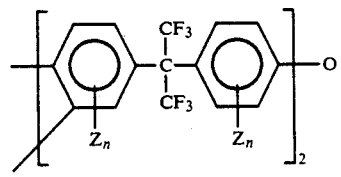

(2) R' is a monovalent moiety independently selected from:

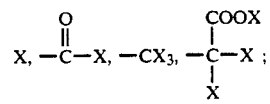

X is hydrogen or a substitutent independently selected from: substituted or unsubstituted lower alkyl of 1 to 8 carbons and substituted or unsubstituted phenyl; Z is independently selected from chloro, bromo, fluoro, iodo and lower alkyl of 1 to 6 carbons; n is independently 0 to 1; and (3) R" is selected from a substituted or unsubstituted alkylene, alicyclic or arylene moiety.

The photosensitizer compositions of the present invention are present in photosensitive compositions in an amount of 0.5 to 50%, preferably 1 to 20% by weight of the solids in the composition, most preferably 3 to 10%. The photoresist compositions of the present invention generally contain 5 to 50%, preferably 5 to 30% by weight (based on the weight of solids in the composition) of the fluorinated hydroxy polyamide.

The mixture can contain, as conventional components, polymerization inhibitors, oxygen scavengers, hydrogen donors, sensitometric regulators, dyes, pigments and plasticizers.

Suitable actinic radiation to which the photoresist compositions of the present invention is sensitive includes visible, ultraviolet. Broad Band UV, UV at 365 nm and 436 nm are preferred.

The photosensitive compositions of the present invention may be employed in a photoresist solution which can be applied to a substrate by any suitable method, e.g. roller coating, dipping, spraying, whirling and spin coating. Suitable substrates include silicon, aluminum, glass, polymeric resin boards and films, silicon dioxide, silicon nitride, tantalum, copper, polysilicon ceramics and aluminum/copper mixtures.

Suitable application solvents include methyl ethyl ketone, propylene glycol methyl ether (PGME), propylene glycol methyl ether acetate (PGMEA), cyclopentanone, acetone, N-methylpyrrolidone (NMP) and gamma-butyrolactone (Y-BLO).

Suitable developing solutions for the radiation sensitive composition of the present invention are aqueous solutions of inorganic alkaline compounds such as those of sodium silicate, potassium silicate, sodium hydroxide, potassium hydroxide, lithium hydroxide, sodium phosphate, sodium monohydrogen phosphate, ammonium phosphate, ammonium monohydrogen phosphate, sodium metasilicate, sodium bicarbonate, ammonia, etc., with a suitable concentration of these compounds being between about 0.1 and 10, more preferably between 0.5 and 5%, by weight. Specific examples of developer solutions are disclosed in U.S. Pat. Nos. 3,110,596; 3,173,788; 3,586,504; etc.

Such an alkaline solution can also contain certain organic solvents such as alcohols (e.g., methanol, ethanol, benzyl alcohol, etc.) as well as a surface active agent (e.g., sodium alkylnaphthalene sulfonate, sodium lauryl sulfate, etc.) depending on the requirements.

The following examples are illustrative of the invention:

EXAMPLE 1

Into a test tube equipped with a thermometer and shielded from light were added 3.4 grams (0.01 mole) hexafluoro-bis-phenol (F6-Bisphenol), 5.9 grams (0.022 mole) diazo-L-sulfonyl chloride (DLSC), 15.0 grams acetone. The mixture was stirred until the F6-Bisphenol and DLSC had completely dissolved. The solution was warmed to 26° C. and 7.5 grams N-methyl-pyrrolidone (NMP) was added dropwise over a period of 15 minutes, as the solution was gradually warmed to 32° C. over a period of 15 minutes. About 2.5 grams of N-methyl morpholine NMM (molecular weight 101.15, 0.025 mole) was added. The temperature initially dropped to about 25° C., but over a period of 30 minutes gradually heated back up to 30° C. because of the exothermic reaction which took place. The material was then warmed to 35° C. over a period of 60 minutes.

1 gram of glacial acetic acid was then added. The material was then stirred and allowed to sit for 30 minutes at 25° C. Crystals formed and 31 grams of additional NMP was added and the mixture stirred. Before the crystals were completely redissolved, the mixture was poured into 500 ml of 1N hydrochloric acid (HCL). 5.0 grams of additional NMP was added to the test tube to rinse the test tube and this was also poured into the 1N HCL. The mixture was stirred for 1 hour, filtered and washed with an additional 500 ml of 1N HCL, then washed with 500 ml of distilled water. The filtered and washed product was then sucked dry in an air oven at room temperature and subsequently dried in the air oven for 24 hours at 40° C. 7.7 grams of (2,1,5 Diazo Ester of 2,2Bis(4-hydroxyphenyl)hexafluoropropane Diazo-L Ester of BF$_6$) was produced, having a diazo content of 98.5%.

EXAMPLE 2

Into a test tube fitted with a thermometer and shielded from light were added 4.1 grams (0.006 mole) 4,4'-Bis[2-(4-hydroxyphenyl hexafluoroproply)]diphenyl ether (12F-DMDE), 3.55 grams (0.0132 mole) diazo-L-sulfonyl chloride (DLSC), 10.0 grams acetone and 5.0 grams N-methyl-pyrrolidone (NMP). The mixture was stirred and warmed to 35° C. over a period of 15 minutes until the 12F-DMDE and DLSC dissolved. The solution was allowed to cool to 30° C. 1.5 grams NMM (N-Methyl Morpholine) (0.015 moles) was initially added and the mixture was continuously stirred and warmed to 35° C. over a period of 15 minutes. The exothermic reaction was slowly initiated and the remainder of the 1.5 grams NMM was added slowly over a period of 5 minutes. The reaction mixture was continuously stirred and a temperature of 37° C. was maintained over several minutes, due to the slowly exothermic reaction. The total reaction time was about 30 minutes and the temperature of the reaction mixture was allowed to gradually drop to 28° C., until the reaction was completed. The reaction product was warmed to 40° C. and allowed to sit at 40° C. for an additional 1.0 hour.

1.0 gram glacial acetic acid was added, the mixture was stirred and allowed to sit for 60 minutes at 25° C. No new crystals of reaction product were then formed. The mixture was poured into 500 ml 1N hydrochloric acid (HCL) and the resultant mixture was stirred. Reaction product crystallized on the surface and the crystallized surface skin broke up and settled to the bottom as the mixture was stirred. After stirring for 15 minutes, the crystalline reaction product was filtered and washed with 500 ml 1N HCL. The reaction product was then washed with 500 ml distilled water, sucked dry in an air oven at room temperature and subsequently dried in the air over for 24 hours at 40° C. 12.0 grams of (2,1,5-Diazo Sulfonyl Ester of 4,4'-Bis [2-(4-hydroxyphenyl hexafluoroisopropyl)]diphenyl Ether-(2,1,5-Diazo Ester of 12-F DMDE) was produced, having a diazo content of >95%.

EXAMPLE 3

Into a 250 ml Erlenmeyer flask with a thermometer and shielded from light were added 41 grams (0.06 mole) 12F-Bisphenol (4,4'-Bis[2-(4-hydroxyphenyl hexafluoroisopropyl)]diphenyl ether, 35.5 grams (0.132 mole) diazo-L-sulfonyl chloride (DLSC), 100 ml acetone and 50 ml N-methyl-pyrrolidone (NMP). The mixture was stirred and warmed to 28° C. over a period of 15 minutes until the 12F-Bisphenol and DLSC has completely dissolved. 15 grams triethylamine (TEA) was added and the exothermic reaction caused the temperature to rise. The temperature was controlled between 35° C. and 40° C. during the addition of TEA. During the reaction, which took 1.5 hours, the temperature was maintained at about 40° C.

The reaction product was filtered twice and washed with 150 ml acetone. 12.0 grams of glacial acetic acid was added and the mixture was poured into 5 liters of distilled water. The reaction product was partially emulsified and 50 ml of concentrated (31.5 weight percent) HCl was used to break the emulsion. The reaction product was allowed to sit at room temperature for 30 minutes, filtered and washed with 4 liters distilled water. The filtered and washed product was then sucked dry into a firm cake in an air oven at room temperature and subsequently dried in the air oven for 24 hours at 35° C. 70.5 grams of (2,1,5-Diazo sulfonyl ester of 4,4'-Bis[2-(4 hydroxyphenyl hexafluoroisopropyl]diphenyl ether-(2,1,5-Diazo ester of 12-F DMDE), having a diazo content of >95%.

EXAMPLE 4

Into a 500 ml Erlenmeyer flask equipped with a thermometer and shielded from light was added 33.6 grams (0.1 mole) hexafluoro-bis-phenol (F6-Bisphenol), 59.1 grams (0.22 mole) diazo-L-sulfonyl chloride (DLSC), 150 ml acetone and 75 ml N-methyl-pyrrolidone (NMP). The mixture was stirred and warmed slightly from 25° C. to 40° C. over a period of 15 minutes until the F6-Bis phenol and the DLSC had completely dissolved. 25 grams of triethylamine (TEA) was slowly added as the reaction mixture was stirred. Product began to precipitate after about 70% of the TEA had been added. The exothermic reaction was completed in about 15 minutes and the reaction product was allowed to cool for about 30 minutes to a temperature of about 30° C. 100 ml of additional NMP was added as the reaction product was stirred. The reaction product was allowed to sit at room temperature for 1 hour, 12 grams glacial acetic acid was added and the mixture was allowed to sit at room temperature for 30 minutes. The reaction product was then filtered, washed with 2 liters distilled water, filtered again and allowed to sit at room temperature for about 16 hours. The product was washed with 4 liters distilled water, sucked dry in an air oven at room temperature for 8 hours and subsequently dried in the air oven at 35° C. for 64 hours. 80.7 grams of (2,1,5-diazo sulfonyl ester or 2,2-Bis(4-Hydroxyphenyl) hexafluoropropane (Diazo-L ester of BF$_6$) was produced, having a diazo content of 98.5%.

EXAMPLE 5

Synthesis of 2,1,4-Diazo Ester of Hexafluoro-bis-phenol (F6-Bisphenol)

Into a three liter four necked flask equipped with a thermometer, stirring shaft and dropping funnel were added 33.6 grams (0.10 mole) of hexafluorobisphenol (F6-Bisphenol) and 59.1 grams (0.22 mole) of 2,1,4-diazo sulfonyl chloride and 225 ml. of gamma Butyrolactone. The mixture was stirred at room temperature (25° C.) for about 10 minutes to obtain a clear solution.

25 grams of triethylamine was added into the reaction flask over 30 minutes maintaining temperature at 20° C. The reaction mixture was stirred for 4 hours at room temperature. After the reaction was complete, 12.0 ml. of glacial acetic acid was added to destroy any unreacted sulfonyl chloride.

The reaction mixture was precipitated by drowning into 2 liters of deionized water and 200 ml. Methanol. A fine precipitate was obtained which was stirred for several hours then decanted and filtered and washed with about 3 liters of distilled water. The yellow cake was air dried first at room temperature by sucking vacuum over buchner funnel. When the cake was air dried, it was placed in the vacuum oven at 40°-50° C. overnight. The yield of the product was 80 grams.

HPLC data indicate ester distribution to be: >95%.

EXAMPLE 6

Synthesis of 2,1,4-Diazo Ester of 4,4'-Bis[2-4-(hydroxyphenyl hexafluoroisopropyl)diphenyl Ether:

Into a three liter four necked flask equipped with a thermometer, stirring shaft and dropping funnel were added 14.2 grams (0.0217 mole) of 4-4'-Bis[2-4-(hydroxyphenyl hexafluoroisopropyl)diphenyl Ether and 12.3 grams (0.0457 mole) of 2,1,4-diazo sulfonyl chloride and 80 ml. of gamma Butyrolactone. The mixture was stirred at room temperature (25° C.) for about 10 minutes to obtain a clear solution.

8.3 grams of triethylamine was added into the reaction flask over 30 minutes maintaining temperature at 20° C. The reaction mixture was stirred for 4 hours at room temperature. After the reaction was complete, 4.0 ml. of glacial acetic acid was added to destroy any unreacted sulfonyl chloride.

The reaction mixture was precipitated by drowning into 1.5 liters of deionized water and 150 ml. Methanol. A fine precipitate was obtained which was stirred for several hours then decanted and filtered and washed with about 2 liters of distilled water. The yellow cake was air dried first at room temperature by sucking vacuum over buchner funnel. When the cake was air dried, it was placed in the vacuum oven at 40°-50° C. overnight. The yield of the product was 24.3 grams.

HPLC data indicate ester distribution to be: >95%.

EXAMPLE 7

Synthesis of Meta-Cresol/3,5-Dimethyl Phenol Formaldehyde Novolak Resin

Into a 500 ml. three necked flask were charged 108 grams (1.0 mole) meta-cresol, 40.26 grams (0.33 mole) 3,5-dimethyl phenol, 3.0 grams maleic anhydride and 70 ml. diglyme. The cresol mixture is heated under stirring and nitrogen flow to 98 degree C. At this temperature 83.0 ml. (0.77 mole) 37% formaldehyde solution is slowly added by dropping funnel during a period of one hour. The condensation reaction is allowed to continue for four hours at 98° C. After the condensation water and solvent are distilled off first at room atmospheric pressure till 200° C. At this stage, 30 mm pressure was applied to distill residual solvent and cresol mixture at a maximum temperature up to 220° C. The vacuum at 220° C. is for one hour before the liquified resin is poured into a cooling tray. The resin obtained has a viscosity of 13.8. (7.0% solution in Cyclohexanone.)

EXAMPLE 8

Into an Erlenmeyer flask were added 0.5 grams (BF12-DLSC ester) sensitizer, having a diazo content of 98.5% and 0.5 grams of a polyamide resin which was produced according to Example 1 or application Ser. No. 915,342 by reacting hexafluoro-2,2'-bis(3-amino-4-hydroxyphenyl)propane with a 50/50 mixture of isophthaloyl chloride and terephthaloyl chloride and 0.04 gm of Crystal Violet. 10 ml of Cyclopentanone were added and the mixture was stirred at 25° C. until all the solids were in solution. The resulting photosensitive solution had a solids content of 10 weight % and a resin to sensitizer ratio of 1 to 1, by weight.

The photosensitive solution was roller coated onto an anodized aluminum plate. The resultant coating had a very uniform thickness and appearance. The coated aluminum plate was exposed for 90 seconds in a contact vacuum printer having a broad band photopolymer UV lamp. The exposed plate was treated with AZ developer for 120 seconds by immersing the plate into the developer solution to develop the image, which developed very well in the light/dark regions. The lines and spaces were very clear down to 4 microms (light and dark regions), had a 99/1% dots in the dark and light regions and a 4/5 step wedge.

EXAMPLE 9

Lithographic Evaluation of 2,1,5-Dizao Ester of 12F-DMDE and 2,1,4-Diazo Ester of 12F DMDE, as Sensitizers Structures and Sample Nos.:

-continued

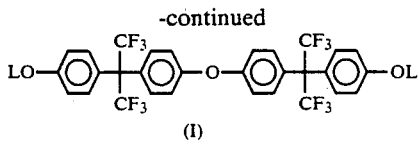
(I)

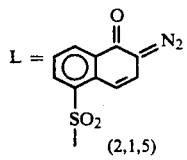
(2,1,5)

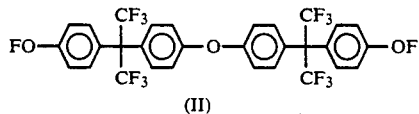
(II)

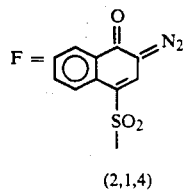
(2,1,4)

Formulations: Both sensitizers were formulated with UPN 110 Novolak resin as follows (all percents are by weight):

---

1) 6% 12F/2,1,5 sensitizer (I) (Listed in Example 5)
   24% Novolak resin (Listed in Example 7)
   70% PGMEA
   This formulation is labelled (A)
   Absorptivity = 0.818 L/g. cm @ 398 nm
2) 6% 12-F/2,1,4 sensitizer (II) (Listed in Example 6)
   24% Novolak resin (Listed in Example 7)
   70% PGMEA
   This formulation is labelled (B)
   Absorptivity = 0.871 L/g.cm @ 377 nm

---

Lithography:

---

1) 12F/2,1,5 sensitizer: formulation (A)
   spin speed to obtain 2.3 um films: 2600 rpm/30 sec
   soft-bake: 90° C. for 30 min
   exposure: films were exposed under a gradient step tablet to 100 mj/cm2 broadband UV light monitored at 405 nm.
   development: 0.27N TMAH/no surfactant (2.38%) 1 minute/25 deg C.
   Results: photospeed: 56 mj/cm2 Broad Band @ 405 nm
   contrast: 4.1
   corr. coef.: 0.994
   films were clear and uniform
   no problems with development.
2) 12F/2,1,4-sensitizer; formulation (B)
   spin speed to obtain 2 um films: 2300 rpm/30 sec
   soft-bake: 90° C. for 30 min
   exposure: exposed under gradient step tablet to 150 mj/cm2 narrowband 365 nm UV light monitored @ 365 nm.
   development: 0.27N TMAH/no surfactant (2.38%) 1 minute/25 deg C.
   results: photoseed: 90.6 mj/cm2 I-Line 365 nm
   contrast: 3.4
   corr. coef.: 0.985
   films were clear and uniform
   no problems with development.

---

The invention has been described by way of the above specification and illustrative examples. It is to be understood that this invention is not limited to the specific embodiments thereof except as defined by the following claims:

We claim:

1. A photosensitizer composition comprising a diazo fluorinated ester containing the hexafluoroisopropylidene group, said photosensitizer consisting essentially of the reaction product of a dizao sulfonyl chloride and a compound selected from hexafluoro-bis-phenols having the following formula:

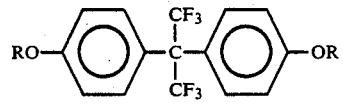

where R is selected from hydrogen, methyl, ethyl and phenyl; and bis-hexafluoroethers having the following formula:

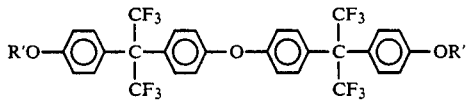

wherein R' is selected from hydrogen, methyl, ethyl and phenyl.

2. The photosensitizer composition according to claim 1 wherein said composition comprises a hexafluoro-bis-phenol wherein R is hydrogen.

3. The photosensitizer composition according to claim 1 wherein said composition comprises a bis-hexafluoroether wherein R' is hydrogen.

4. The photosensitizer composition according to claim 1 wherein 50 to 100% of the hydroxy groups are reacted with a diazo sulfonyl chloride.

5. The positive composition comprising a photosensitizer composition according to claim 1 and a fluorinated hydroxy polyamide.

6. A positive photosensitive composition according to claim 5 wherein said fluorinated hydroxy polyamide comprises the reaction product of an acid chloride with hexafluoro-2'2-bis-(3-amino-4-hydroxyphenyl)propane.

7. A positive photosensitive composition according to claim 5 wherein said fluorinated hydroxy polyamide comprises a polyamide having the structure:

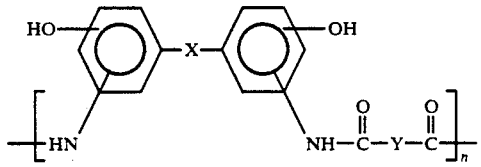

where "X" is selected from S, SO$_2$, direct link, O, R—C—R and C=O; "Y" is selected from S, SO$_2$, direct link, phenyl,

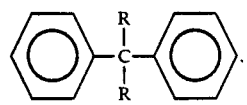

or

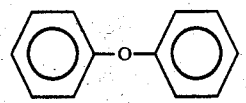

and "R" is CF3, lower alkyl or phenyl, provided that at least one of eitehr "X" or "Y" is an "R" containing group in which "R" is CF3.

8. A positive photosensitive composition according to claim 5 wherein said fluorinated hydroxy polyamide comprises a polyamide having the structure:

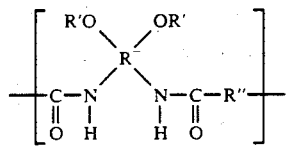

wherein (1) R is a tetravalent aromatic moiety of the formula:

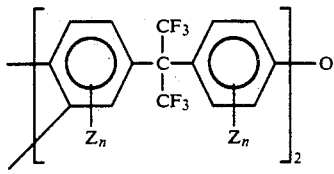

(2) R' is a monovalent moiety independently selected from:

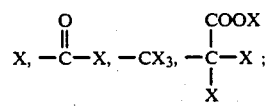

X is hydrogen or a substitutent indpendently selected from: substituted or unsubstituted lower alkyl of 1 to 8 carbons and substituted or unsubstituted phenyl; Z is independently selected from chloro, bromo, fluoro, iodo and lower alkyl of 1 to 6 carbons; n is independently 0 to 1; and (3) R" is selected from a substituted or unsubstituted alkylene, alicyclic or arylene moiety.

9. A liquid positive photoresist composition comprising the photosensitive composition of claim 1, a binder resin and a solvent.

10. The photoresist composition of claim 9 wherein the binder resin comprises a novolak resin.

11. The photoresist composition of claim 9 wherein the binder resin comprises a polyhydroxystyrene resin.

12. The photoresist composition of claim 9 wherein the solvent is selected from the group consisting of methyl ethyl ketone, propylene glycol methyl ether, propylene glycol methyl ether acetate, cyclopentanone, acetone, N-methylpyrrolidone and gamma-butyrolactone.

* * * * *